United States Patent [19]
Aimi et al.

[11] Patent Number: 5,679,609
[45] Date of Patent: Oct. 21, 1997

[54] FABRICATION, TESTING AND REPAIR OF MULTICHIP SEMICONDUCTOR STRUCTURES HAVING CONNECT ASSEMBLIES WITH FUSES

[75] Inventors: Bruno Roberto Aimi, Williston; John Edward Cronin, Milton; André Conrad Forcier, Shelburne; James Marc Leas, South Burlington; Patricia McGuinnes Marmillion, Colchester; Anthony Michael Palagonia, Underhill; Bernadette Ann Pierson, South Hero; Dennis Arthur Schmidt, South Burlington, all of Vt.

[73] Assignee: International Business Machines Corporation, Armonk, N.Y.

[21] Appl. No.: 631,756

[22] Filed: Apr. 12, 1996

Related U.S. Application Data

[62] Division of Ser. No. 404,005, Mar. 14, 1995.

[51] Int. Cl.$^6$ .................................................. H01L 21/60
[52] U.S. Cl. .......................... 437/205; 437/208; 437/209; 437/212
[58] Field of Search ........................ 437/205, 208, 437/209, 211, 212, 214, 215, 217, 219

[56] References Cited

U.S. PATENT DOCUMENTS

| | | | |
|---|---|---|---|
| 5,281,852 | 1/1994 | Normington | 437/205 |
| 5,324,687 | 6/1994 | Wojnarowski | 437/209 |
| 5,466,634 | 11/1995 | Beilstein, Jr. et al. | 437/205 |
| 5,478,781 | 12/1995 | Bertin et al. | 437/209 |
| 5,565,767 | 10/1996 | Yoshimizu et al. | 324/158.1 |
| 5,571,754 | 11/1996 | Bertin et al. | 437/208 |

*Primary Examiner*—Kevin Picardat
*Attorney, Agent, or Firm*—Heslin & Rothenberg, P.C.

[57] ABSTRACT

A multichip semiconductor structure and fabrication method having connect assemblies with fuses which facilitate burn-in stressing and electrical testing of the structure are presented. The structure comprises a multichip stack having standard transfer wire outs to an edge surface thereof. At least some wire outs to the edge surface have fuses electrically series connected thereto such that should an excessive current source/sink arise during burn-in stressing, the corresponding fuse will open circuit. A conductive structure is also disclosed that facilitates the formation of final, operational metallization wiring on the edge surface of the multichip structure prior to burn-in stressing and testing. This conductive structure includes a first conductive level and a second conductive level. The first conductive level has isolated conductors with ends disposed in close proximity. The second conductive level includes islands of strap conductors that electrically interconnect the isolated conductors of the first conductive level. The first conductive level and a second conductive level are constructed of different conductive material which may be separately etched so that the second conductive level may be removed without affecting this first conductive level.

12 Claims, 5 Drawing Sheets

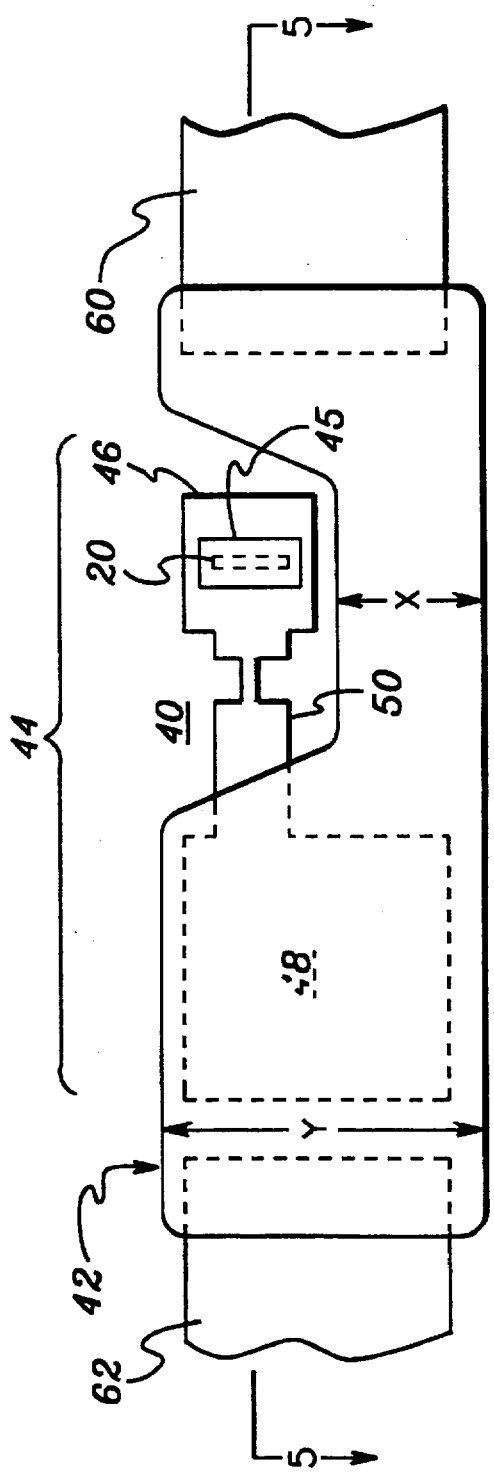
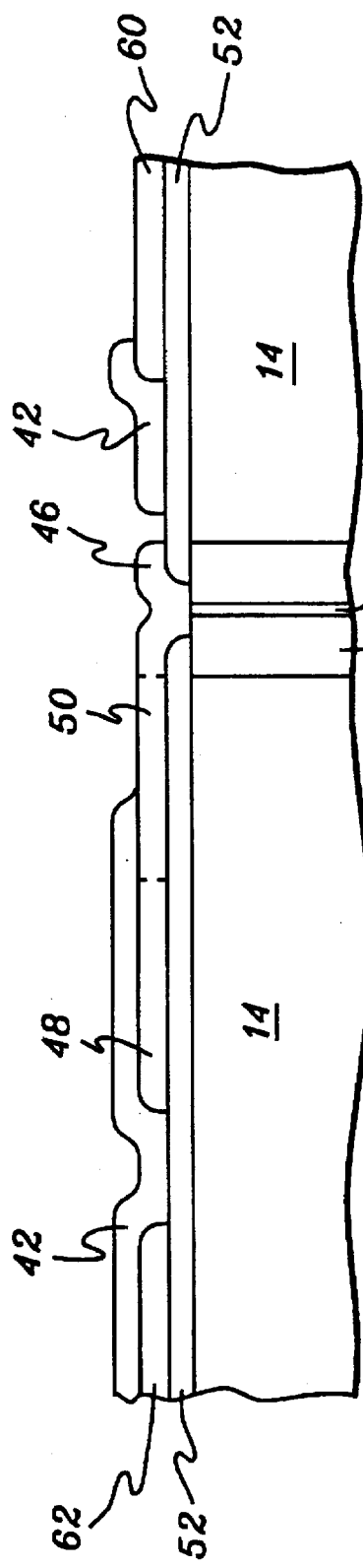

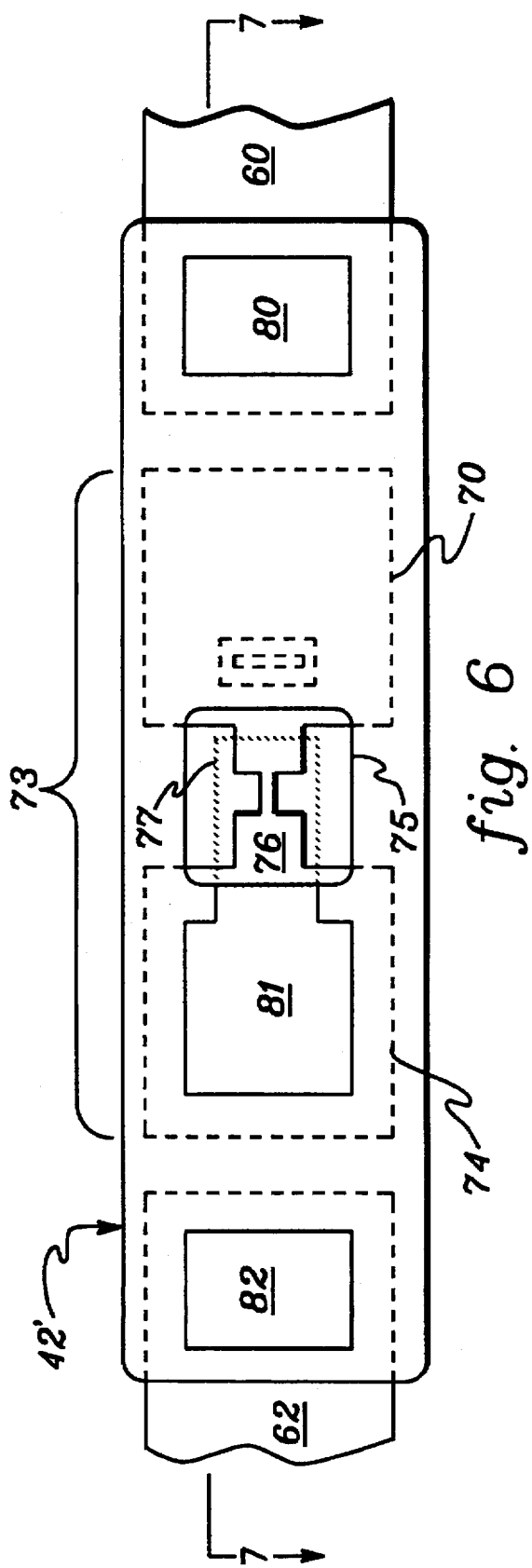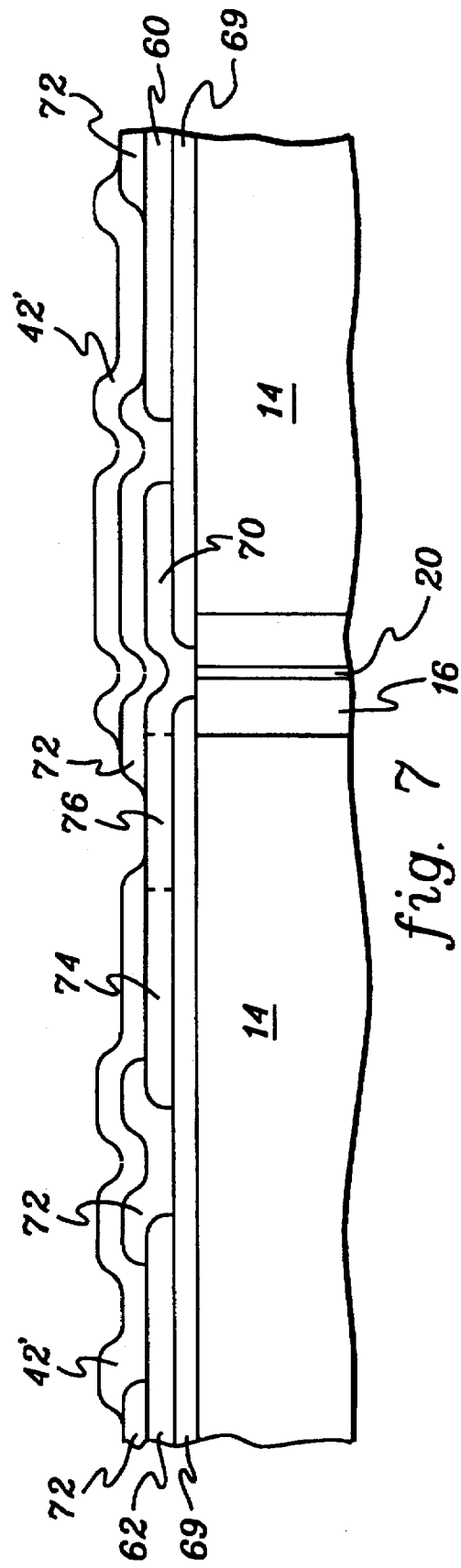

FABRICATION, TESTING AND REPAIR OF MULTICHIP SEMICONDUCTOR STRUCTURES HAVING CONNECT ASSEMBLIES WITH FUSES

This application is a division of application Ser. No. 08/404,005 filed Mar. 14, 1995 which application is now: pending.

TECHNICAL FIELD

The present invention relates in general to fabrication, testing and repair of high density electronic circuit packages having an optimized number of circuit elements included within a given volume. More particularly, the invention relates to connect assemblies for an edge surface of a multichip semiconductor stack. The connect assemblies employ fuses for automatic disconnect of a shorted wire out from a semiconductor device chip in the stack. Further, the invention relates to a connect structure that facilitates selective etching of a conductive pattern on the edge surface of the stack for repair/reconfiguration of semiconductor device chip interconnects.

BACKGROUND ART

Semiconductor structures comprising three-dimensional arrays of chips have emerged as an important packaging approach. A typical three-dimensional electronic structure consists of multiple integrated circuit chips having main planar surfaces adhesively secured together to form a monolithic structure (referred to as a "stack" or "cube"). Two common types of semiconductor chip stacks are the vertically-extending (or "pancake") stack and the horizontally-extending (or "breadloaf") stack. A metallization pattern is often provided directly on one (or more) edge surface(s) of the multichip stack for interconnecting the semiconductor chips and for electrical connection of the stack to external circuitry. This metallization pattern can include both individual electrical connects and bused electrical connects.

At least one redundant chip is often provided in the multichip semiconductor stack so that if one of the primary chips in the stack should fail following stack fabrication and/or stressing (i.e., burn-in), the redundant chip may be "invoked" to provide the electronic circuit package with the desired performance level. This activity is referred to in the art as "sparing." A preferred technique for providing programmable sparing capability to a multichip package, either with or without the inclusion of a spare chip in the multichip package, is set forth in commonly assigned, copending application Ser. No. 08/220,086, entitled "Semiconductor Stack Structures and Fabrication/Sparing Methods Utilizing Programmable Spare Circuit."

Conventional testing of a multichip semiconductor structure involves individual testing of the semiconductor device chips in the stack prior to burn-in stressing of the stack. If a short circuit is encountered, then the effected chip, or a portion thereof, is isolated. Thereafter, burn-in stressing and testing of the multichip semiconductor stack is performed, during which time further semiconductor device chip short circuits may occur. Should this happen, the burn-in process must be discontinued. The failed circuitry must then be isolated and disconnected, afterwhich the burn-in process can be reinitiated. Obviously, this entire process can be time consuming and labor intensive. Conceivably, iterative burn-in stressing and isolation of defective circuits within the multichip stack might occur using this approach.

The isolation of shorted chips is required because a short circuit defect on one semiconductor device chip in the multichip stack can effect burn-in stressing of other semiconductor device chips in the stack. For example, a short circuit on a power plane of a semiconductor device chip in the stack can actually lower the voltage level being applied to adjacent semiconductor device chips, thereby potentially defeating burn-in stressing/testing conditions on these adjacent chips, i.e., unless the above-described iterative process is followed.

Burn-in stressing and testing of a multichip semiconductor structure is most effective after final operational interchip wiring has been formed. However, repair of a multichip stack after final wiring has been added is difficult. For example, if an input/output transfer wire shorts to ground it is nearly impossible to repair. Since multichip stack fabrication costs can be significant, a repair technique subsequent to final wiring would be a significant factor in insuring the feasibility of high density electronic circuit packaging.

Based upon the above, there remains a need in the art for an enhanced multichip semiconductor structure which requires only a single burn-in stressing and testing cycle, and which is readily rewirable notwithstanding the existence of final interchip connections.

DISCLOSURE OF INVENTION

Briefly summarized, in a first aspect the present invention comprises a multichip semiconductor structure that includes a plurality of semiconductor device chips each having a planar main surface. The semiconductor device chips are disposed in a stack such that the planar main surfaces are substantially parallel. At least one semiconductor device chip in the stack has at least one wire out to an edge surface of the stack. The structure further includes at least one fuse. Each fuse is electrically series connected to a wire out of the at least one wire out from the at least one semiconductor device chip in the stack.

In another aspect, the invention comprises a conductive structure for a semiconductor device. The conductive structure includes a first conductive level having a first conductor and a second conductor. The first conductor and the second conductor have ends disposed in close proximity relative to their lengths. The first conductive level comprises a first conductive material. A second conductive level is disposed above the first conductive level and includes at least one strap conductor that is electrically coupled to the ends of the first conductor and the second conductor. The second conductive level comprises a second conductive material which is separately etchable from the first conductive material such that the second conductive level may be removed without affecting the first conductive level. Preferably, the first conductor and the second conductor comprise elongate lengths of isolated metal each having a length substantially greater than the length of the strap conductor.

In still another aspect, a method for fabricating a multichip semiconductor structure is presented that includes the steps of: forming a multichip stack by securing together a plurality of semiconductor device chips such that planar main surfaces of the semiconductor device chips are substantially parallel, the semiconductor device chips including wire outs to an edge surface of the multichip stack; and metallizing the edge surface of the multichip stack to form at least one connect assembly electrically connected to at least one wire out to the edge surface, each connect assembly being connected to an associated wire out and each including a contact pad and a fuse. The fuse is electrically series connected between the contact pad and the associated wire out such that open circuiting of the fuse automatically disconnects the associated wire out from the contact pad.

To summarize, presented herein is a connect assembly for multichip semiconductor structures that can automatically disconnect a chip having a short circuit arising during stack burn-in stressing and testing, thereby ensuring the validity of burn-in for the other semiconductor device chips grouped in the multichip structure. Thus, simultaneous burn-in of large numbers of semiconductor device chips is possible. There is no process complexity or cost added to the stack burn-in process. The connect assembly includes fuses formed in the same wiring level as the conventional T-connect pads coupled to the chip wire outs. The same masking and evaporation steps may be employed in forming these connect assemblies. After testing, the connect assemblies can be removed to allow deposition of final edge surface metallization. Alternatively, the assemblies can remain in place and serve as a means to subsequently automatically or manually disconnect a failing semiconductor device chip. The connect assemblies facilitate practical implementation of stack burn-in stressing and testing.

Further, an open circuited fuse in one or more of the assemblies can serve to flag a defective chip or defective chip wire out. Advantageously, all wire outs from the semiconductor device chips in the stack can be protected via an associated connect assembly having a fuse as provided herein. Thus, any input/output line sourcing or sinking large currents can be automatically isolated before affecting other chips in the stack. Chip burn-in stressing and testing with final wiring patterns in place is also possible through the use of a novel conductive structure that facilitates repair of a multichip semiconductor stack having redundant chips. Considering the fabrication cost of multichip semiconductor stacks, the ability to repair is a significant advantage.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 4 is a partial plan view of a conductive structure in accordance with another aspect of the present invention, shown with a connect assembly such as presented in FIGS. 1-3;

FIG. 5 is a cross-sectional elevational view of FIG. 4 taken along line 5—5;

FIG. 6 is a partial plan view of an alternate embodiment of a conductive structure in accordance with the present invention, again shown with a connect assembly such as presented in FIGS. 1-3; and FIG. 7 is a cross-sectional elevational view of FIG. 6 taken along line 7—7.

BEST MODE FOR CARRYING OUT THE INVENTION

Figure 1:
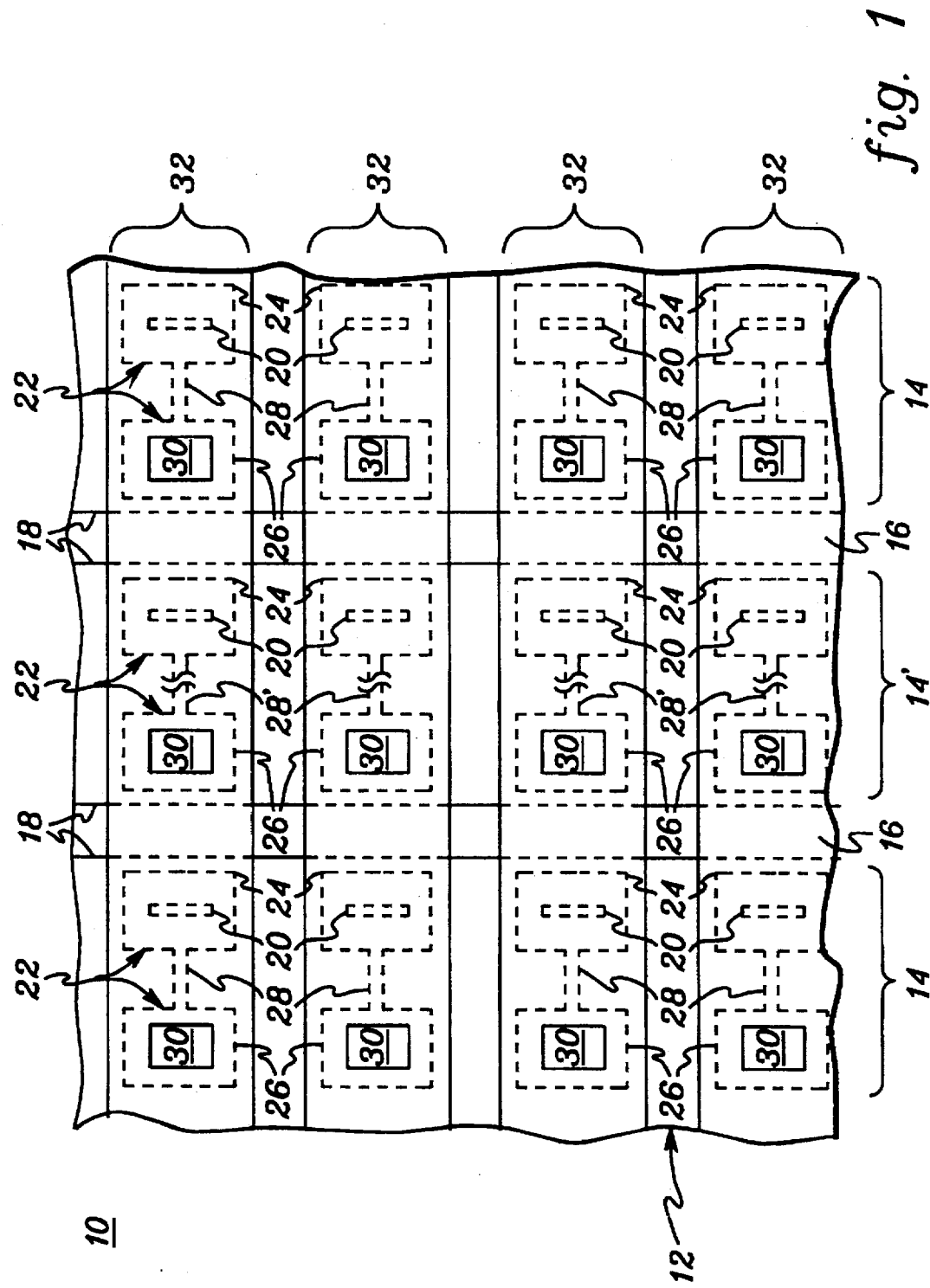
FIG. 1 is a partial plan view of an edge surface of a multichip semiconductor structure having connect assemblies in accordance with the present invention, with the fuses associated with one semiconductor device chip in the stack shown open circuited.

The structures and methods of the present invention can best be understood with reference to FIGS. 1-7, wherein the same or similar reference characters are used throughout multiple figures to designate the same or similar components. FIG. 1 depicts one embodiment of a multichip semiconductor structure, denoted 10, in accordance with the present invention. Structure 10, generally referred to in the art as a multichip "stack" or "cube", includes an edge surface 12 partially defined by the common edge surfaces of a plurality of semiconductor device chips 14, 14' comprising the multichip semiconductor structure. The semiconductor device chips of structure 10 are bonded together via adhesive layers 16 such that planar main surfaces 18 of the chips are substantially parallel. For further examples of multichip stacks, reference the above-designated copending application.

Brought to edge surface 12 of structure 10 are conventional transfer wirings or wire outs 20 from the individual semiconductor device chips 14 in the stack. Wire outs 20 comprise external connect lines to the individual chips in the stack, and include power plane connections, such as power and ground, and input/output connections, such as address and control lines. In accordance with one aspect of the present invention, each wire out 20 is electrically tied to a respective connect assembly 22 disposed on the edge surface of the stack. Each connect assembly 22 includes a T-connect pad 24, and a contact pad 26 electrically coupled thereto via a fuse line 28. Preferably, the structures comprising connect assemblies 22 are all first level conductors (i.e., metal level 1 (M1) conductors) formed on edge surface 12 of multichip semiconductor structure 10. Configurations of the elements comprising the connect assemblies can vary as desired for a given implementation. The various configurations depicted herein are provided by way of example only.

Significant to this aspect of the invention is the provision of fuse line 28, 28' interconnecting T-connect pad 24, e.g., a conventional T-connect pad coupled to the associated wire out, and primary contact pad 26. Electrical connection to the associated wire out 20 is therefore made through contact pad 26, fuse line 28 and T-connect pad 24. Fuses 28 provide a means to automatically disconnect the respective wire out should the transfer wire source or sink an excessive current, for example during burn-in stressing and testing of the multichip semiconductor structure. Thus, with connect assemblies 22 it is possible to simultaneously burn-in stress and test a long stack of semiconductor device chips without requiring interruption in the burn-in process upon the occurrence of a short circuit in one or more of the chips in the stack. Note that should a short occur to a power plane wire out of a semiconductor device chip, the chip will be disconnected and power supply voltage levels to neighboring chips will remain unaffected, notwithstanding that a single power supply drives all chips in the stack during testing. Note also that the same masking and evaporation steps by which conventional T-connect pads 24 are formed may be employed to simultaneously fabricate the desired fuse lines 28 and contact pads 26.

Although connect assemblies 22 are particularly desirable in association with power plane wire outs (to automatically disconnect a defective chip sinking or sourcing large currents), their ease of implementation permits their use in association with all wire outs from the individual chips in the stack. This would guard against a short occurring in an input/output wire out as well. By way of example, chip 14' in FIG. 1 is shown with four wire outs 20 being connected to open circuited fuse lines 28'.

After burn-in stressing and testing, connect assemblies 22 can be polished off and standard edge surface interconnect wiring can be formed. Alternatively, the connect assemblies can remain in place, permitting open fuses to serve as flags to avoid interconnecting chips of the stack that failed burn-in. Further, a semiconductor device chip failing burn-in testing but having intact fuses can be easily disconnected from other chips in the stack by electrically, optically or mechanically opening appropriate fuses coupled to its wire outs.

After burn-in, temporary or permanent contact can be made to connect assemblies 22 through first conductive level/second conductive level (M1/M2) vias 30 aligned with contact pads 26. As shown, M1/M2 vias 30 can be interconnected for testing or final operation through buses 32 formed in the second conductive level. Notwithstanding that M1/M2 vias 30 are shown in chip 14', the chip is disconnected from other chips in the stack since the respective fuse lines 28' are open circuited.

An edge surface interconnect pattern such as shown in FIG. 1 can be formed by depositing a layer of insulation (not shown) over the first conductive layer having connect assemblies 22. After forming the insulation, vias 30 can be opened to contact pads 26. Since they are formed after burn-in stressing and testing, the vias can be opened over contact pads 26 irrespective of whether the associated chip wire out has failed. This is because open circuited fuses will prevent connection to a defective chip. The second conductive layer is then deposited and patterned to form, for example, interconnecting buses 32.

Figure 2:
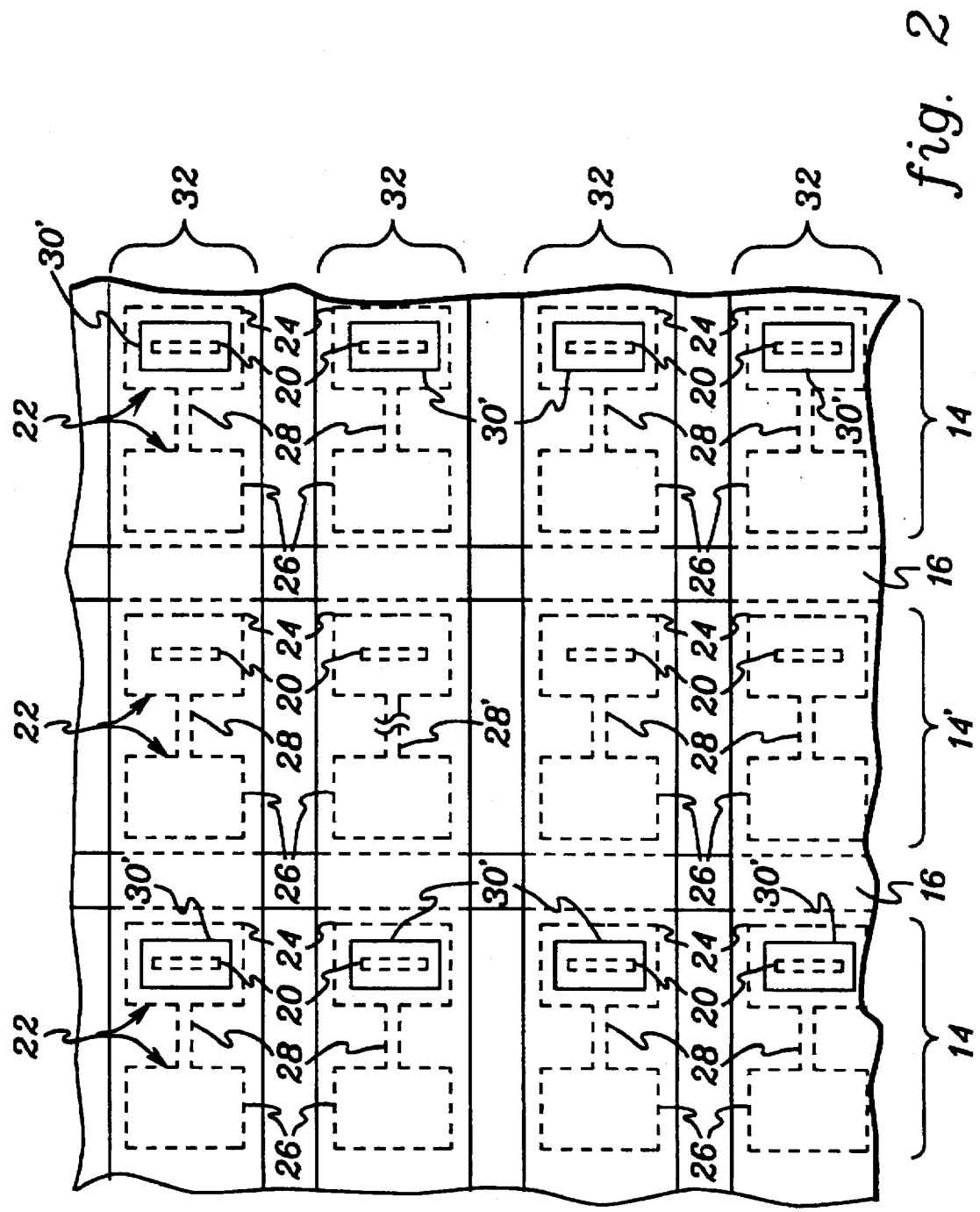
FIG. 2 is a partial plan view of an edge surface of a multichip semiconductor stack having connect assemblies in accordance with the present invention, with post-testing electrical connections shown directly atop wire outs from the individual chips.

FIG. 2 presents an alternate embodiment of an edge surface wiring pattern for the multichip semiconductor structure of FIG. 1. In this embodiment, M1/M2 vias 30' have been formed directly over T-connect pads 24 of connect assemblies 22. This wiring pattern avoids any possible resistive or inductive loss that might arise with final, operational-type connections to the wire outs through fuse lines 28. The fuse lines would only be series connected to the wire outs during burn-in stressing and testing. Therefore, any possibility of performance degradation due to series inclusion of the fuse line is avoided. Note that a defective chip, in this case chip 14' having an open circuited fuse line 28', is unconnected to the respective "final" bus 32 of the second conductive layer since a via 30' has not been opened for chip 14'.

Figure 3:
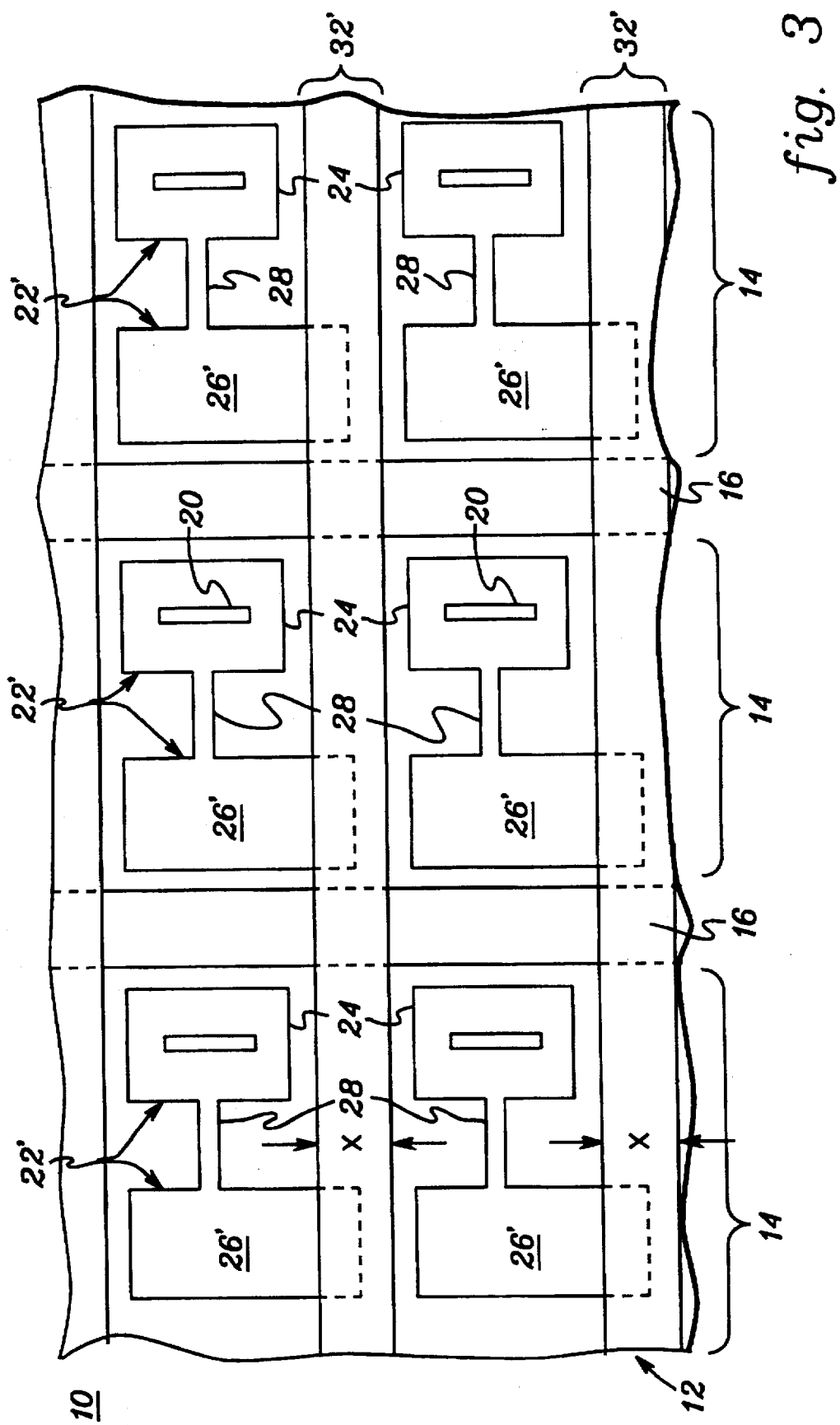
FIG. 3 is a partial plan view of an edge surface of a multichip semiconductor stack having connect assemblies in accordance with the present invention configured such that wiring in the second conductive level is largely offset from the connect assemblies in the first conductive level.

FIG. 3 depicts a further conductive pattern variation for edge surface 12 of the multichip semiconductor structure 10. In this example, each connect assembly 22' has a rectangular-shaped contact pad 26' which extends below its associated fuse line 28 and T-connect pad 24 such that a second conductive level (M2) bus 32' interconnects connect assemblies 22' as shown without obscuring the respective fuse lines 28. Thus, a chip can be isolated from the stack after all wiring on the stack has been completed. This aspect of the invention provides the further advantage of allowing formation of a final operational metallization pattern on the edge surface of the multichip semiconductor structure prior to burn-in stressing and testing of the chips. This enables burning-in of that final level and may provide more accurate loading, especially capacitive loading, which can influence rise/fall times and timing interactions between semiconductor device chips in a stack during test. However, when burning in a long stack it is easiest to determine which chip failed if the chips are not interconnected. Note that deposition of a layer of insulation between conductive levels (M1) & (M2) on the edge surface, followed by formation of vias, is not required in this embodiment. However, there must be sufficient spacing between wire outs 20 of the individual semiconductor device chips so that distance "x" is sufficiently large to meet performance requirements.

A further alternative to retaining visibility of a fuse line in accordance with the present invention is depicted in FIGS. 4 & 5. In particular, a notch 40 can be formed in the interconnecting M2 line 42 to expose the fuse. Regions of greater width "y" in this embodiment serve to lower resistance of line 42. As is well known, resistance of a conductive line is proportional to the width of the line.

FIGS. 4 & 5 also introduce a second aspect of the present invention, namely, a novel conductive structure. By way of example, this structure is discussed herein relative to a multichip stack. However, the interconnect concept is generally applicable to wiring for any semiconductor device. As in prior embodiments, a connect assembly 44 includes a conventional T-connect pad 46 disposed over and electrically connected to a chip wire out 20. T-connect pad 46 is coupled to a contact pad 48 via a fuse line 50. Novel to this embodiment is the provision of a strap conductor 42 in the second conductive layer (M2) configured to interconnect a first isolated "island" Conductor 60 and a second isolated "island" conductor 62 in the first conductive layer (M1). In this example, strap conductor 42 also connects to contact pad 48 of connect assembly 44. First conductor 60 and second conductor 62 preferably comprise isolated, elongated lengths of metal in the first conductive layer, which principally interconnects the chips in a multichip stack. The length of strap conductor 42 relative to the length of first conductor 60 or the length of second conductor 62 is substantially less (e.g., one-fifth or less) such that principal interconnections between adjacent chips in the multichip stack might comprise the first and second conductors.

As a further characteristic, first conductor 60 and second conductor 62 are preferably both fabricated of a first conductive material which is different from a second conductive material employed to fabricate strap conductor 42 so that strap conductor 42 can be selectively etched without affecting first conductor 60 and second conductor 62. Thus, each connect assembly 44 is also preferably fabricated of the same material as the first conductor and second conductor. As examples, the first level/second level conductive materials may comprise gold/copper, aluminum titanium nitride composite/tungsten or aluminum/copper. Those skilled in the art will recognize other combinations which may be employed in accordance with the principles of the present invention. Finally, note from FIG. 5 that no insulation layer is required in this embodiment between the first conductive layer M1 and a second conductive layer M2.

Again, the first conductor and the second conductor, along with the connect assemblies, are all disposed on the first conductive layer (M1) above the semiconductor device, which is this example comprises a multichip semiconductor structure such as that discussed above and partially depicted in FIG. 5. The first conductor, second conductor and strap conductor concept presented herein can be generalized to encompass connection to any third conductor, for example, to a connect assembly such as assembly 44, or could simply comprise an interconnection means for establishing a conductive line.

The advantage to the conductive structure presented is an ability to readily rework the conductive pattern on the edge surface of the stack. For example, after selectively etching the second conductive layer, desired interconnections can be made employing, for example, a focused ion beam machine. The structure advantageously allows selective removal of the island strap conductor(s), for example, for repair of the underlying semiconductor device or for isolation of a defective circuit. If the semiconductor device comprises a multichip semiconductor stack, then by selectively removing the strap conductors a semiconductor device chip in the stack might be disconnected, i.e., as an alternate to blowing fuses. Additionally, by being able to reconfigure the "final" metallization pattern on one or more edge surfaces of a multichip stack, fabrication and repair yields will increase.

Another embodiment of a conductive structure in accordance with the present invention is depicted in FIGS. 6 & 7. This embodiment is similar to the embodiment presented in FIGS. 4 & 5, except that instead of a notch, the fuse is exposed through a central opening 75 in strap conductor 42. To prevent shorting of the second conductive layer to the T-connect pad 70 of connect assembly 73, an insulator layer 72 is disposed therebetween. Layer 72 is a second insulator layer since an insulator layer 69 is disposed directly on the edge surface of the multichip stack. An M1/M2 via passes through insulator layer 72 to connect to contact pad 74 of connect assembly 73. This via is metallized to interconnect the first conductive layer and the second conductive layer in an area 81 above contact pad 74 and remains opened in an area 77 above fuse line 76 of connect assembly 73 to expose the fuse. M1/M2 vias 80 & 82 are also provided to connect strap conductor 42' and first conductor 60 and second conductor 62, respectively. The strap conductor configuration of this embodiment may posses an enhanced current flow characteristic as compared with that of the strap conductor configuration of FIGS. 4 & 5.

To summarize, presented herein is a connect assembly for multichip semiconductor structures that can automatically disable a defective wire out arising during stack burn-in stressing and testing, thereby ensuring the validity of burn-in for all semiconductor device chips grouped in the multichip structure. Thus, simultaneous burn-in of large numbers of semiconductor device chips is possible. There is no process complexity or cost added to the stack burn-in process. The connect assembly includes fuses formed in the same wiring level as the conventional T-connect pads coupled to the chip wire outs. The same masking and evaporation steps may be employed in forming these connect assemblies. After testing, the connect assemblies can be removed to allow the formation of final edge surface metallization. Alternatively, the assemblies can remain in place and serve as an automatic means to subsequently disconnect a failing semiconductor device chip. The connect assemblies facilitate practical implementation of stack burn-in stressing and testing.

Further, an open circuited fuse in one or more of the assemblies can serve to flag a defective chip or defective chip wire out. Advantageously, all wire outs from the semiconductor device chips in the stack can be protected via an associated connect assembly having a fuse as provided herein. Thus, any line sourcing or sinking large currents can be automatically isolated before affecting other chips in the stack. Chip burn-in stressing and testing with final wiring patterns in place is also possible through the use of a novel conductive structure that facilitates access to the fuses of each chip, thus enabling repair of a multichip semiconductor stack having redundant chips. Further advantage is achieved from the ability to remove a portion of the second level wiring without affecting the final level wiring. Considering the fabrication cost of multichip semiconductor stacks, the ability to repair is a significant advantage.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method for fabricating a multichip semiconductor structure, said method comprising the steps of:
   (a) forming a multichip stack by securing together a plurality of semiconductor device chips such that planar main surfaces of said semiconductor device chips are substantially parallel, the semiconductor device chips of said plurality of semiconductor device chips including wire outs to an edge surface of said multichip stack; and
   (b) metallizing the edge surface of said multichip stack to form at least one connect assembly, each connect assembly being electrically connected to an associated wire out of said wire outs to the edge surface and each including a contact pad and a fuse, said fuse being electrically series connected between said contact pad and the associated wire out such that open circuiting of said fuse electrically disconnects said contact pad from the associated wire out.

2. The method of claim 1, further comprising the steps of burn-in stressing and electrically testing said multichip stack, said electrical testing step including for each connect assembly of said at least one connect assembly, electrically contacting said contact pad of said connect assembly to thereby electrically couple to the associated wire out to the edge surface of the multichip stack.

3. The method of claim 2, further comprising the step of removing said at least one connect assembly from said edge surface of said multichip stack subsequent to burn-in stressing and electrical testing of said multichip stack.

4. The method of claim 3, further comprising subsequent to said removing step the step of conductive patterning the edge surface of said multichip stack to electrically connect operational semiconductor device chips of said plurality of semiconductor device chips forming said multichip stack, said operational semiconductor device chips having been identified from said electrical testing step.

5. The method of claim 2, further comprising the step of open circuiting a fuse of a connect assembly associated with a semiconductor device chip failing said burn-in stressing and electrical testing steps.

6. The method of claim 2, further comprising subsequent to said burn-in stressing and electrical testing steps, the step of further metallizing the edge surface of the multichip stack to electrically connect operational semiconductor device chips of said plurality of semiconductor device chips forming said multichip stack, said operational semiconductor device chips having been identified from said electrical testing step.

7. The method of claim 2, wherein said metallizing step (b) further comprises metallizing the edge surface of said multichip stack to form a predefined final electrical connection among said plurality of semiconductor device chips forming said multichip stack.

8. A method for forming a conductive structure on a semiconductor device, said method comprising the steps of:
   (a) forming above the semiconductor device a first conductive level including a first conductor having an end and a second conductor having an end, the ends of said first conductor and said second conductor being disposed in close proximity relative to a length of the first conductor and a length of the second conductor, the first conductive level comprising a first conductive material; and (b) forming a second conductive level above the first conductive level, the second conductive level including a strap conductor disposed to electrically couple the ends of the first conductor and the second conductor of the first conductive level, the second conductive level comprising a second conductive material, wherein the second conductive material is separately etchable from the first conductive material such that the second conductive level may be removed without affecting the first conductive level.

9. The method of claim 8, wherein said semiconductor device comprises a multichip semiconductor structure having a plurality of semiconductor device chips each with a planar main surface, said plurality of semiconductor device chips being disposed in a stack such that said planar main surfaces are substantially parallel, and wherein said forming step (a) comprises forming the first conductive level on an edge surface of the multichip semiconductor structure.

10. The method of claim 9, wherein said multichip semiconductor structure includes multiple wire outs from multiple semiconductor device chips of said plurality of semiconductor device chips in said stack, each wire out of said multiple wire outs being electrically connected to an associated connect assembly of multiple connect assemblies on the edge surface of said stack, and wherein said forming step (b) includes forming said second conductive level such that the strap conductor electrically connects to a wire out of said multiple wire outs through the associated connect assembly of said multiple connect assemblies.

11. The method of claim 10, wherein each connect assembly of said multiple connect assemblies includes a contact pad and a fuse, said fuse being electrically series connected between said contact pad and one wire out of said multiple wire outs, and wherein said forming step (b) includes forming said second conductive level such that said strap conductor is electrically connected to the contact pad of the associated connect assembly of said multiple connect assemblies.

12. The method of claim 11, further in combination with forming a plurality of such conductive structures, said plurality of such conductive structures being disposed on the edge surface of the multiple semiconductor structure.

* * * * *